(12) United States Patent
Yamada et al.

(10) Patent No.: US 10,128,430 B2
(45) Date of Patent: Nov. 13, 2018

(54) VIBRATION ELEMENT MANUFACTURING METHOD, VIBRATION ELEMENT, ELECTRONIC DEVICE, ELECTRONIC APPARATUS, AND MOVING OBJECT

(71) Applicant: Seiko Epson Corporation, Tokyo (JP)

(72) Inventors: Yohei Yamada, Chino (JP); Atsushi Matsuo, Okaya (JP); Toshihiro Il, Minamiminowa (JP); Takatoshi Sugiyama, Tatsuno (JP)

(73) Assignee: Seiko Epson Corporation (JP)

( * ) Notice: Subject to any disclaimer, the term of this patent is extended or adjusted under 35 U.S.C. 154(b) by 305 days.

(21) Appl. No.: 14/992,265

(22) Filed: Jan. 11, 2016

(65) Prior Publication Data

US 2016/0204334 A1   Jul. 14, 2016

(30) Foreign Application Priority Data

Jan. 13, 2015 (JP) ................. 2015-003929

(51) Int. Cl.
| | |
|---|---|
| *H01L 41/09* | (2006.01) |
| *H01L 41/04* | (2006.01) |
| *G01C 19/56* | (2012.01) |
| *H03H 9/05* | (2006.01) |
| *H03H 9/215* | (2006.01) |
| *H03H 9/24* | (2006.01) |
| *H01L 41/331* | (2013.01) |
| *H01L 41/332* | (2013.01) |
| *H03H 3/02* | (2006.01) |

(52) U.S. Cl.
CPC .............. *H01L 41/09* (2013.01); *G01C 19/56* (2013.01); *H01L 41/042* (2013.01); *H03H 9/0547* (2013.01); *H03H 9/215* (2013.01); *H03H 9/2468* (2013.01); *H01L 41/331* (2013.01); *H01L 41/332* (2013.01); *H03H 2003/026* (2013.01); *H03H 2003/027* (2013.01)

(58) Field of Classification Search
CPC ............ B81C 1/00134; B81C 1/00396; B81C 1/00484; B81C 1/00531; B81C 1/00539; B81C 1/00603; C09K 13/00; C09K 13/08; G01C 19/5663
USPC ... 216/13, 17, 41, 49, 51, 57, 67, 83, 97, 99
See application file for complete search history.

(56) References Cited

U.S. PATENT DOCUMENTS

| | | | | |
|---|---|---|---|---|
| 5,400,824 A | * | 3/1995 | Gschwendtner | .......... F15C 5/00 137/625.28 |
| 9,481,174 B2 | * | 11/2016 | Baldi | ................. B41J 2/1603 |

(Continued)

FOREIGN PATENT DOCUMENTS

| | | |
|---|---|---|
| JP | 09-074120 A | 3/1997 |
| JP | 2006-121411 A | 5/2006 |

(Continued)

*Primary Examiner* — J. San Martin
(74) *Attorney, Agent, or Firm* — Harness, Dickey & Pierce, P.L.C.

(57) ABSTRACT

A method of manufacturing a gyro element as a vibration element is a manufacturing method of processing a quartz crystal substrate to form an outward shape of a gyro element including a vibrating arm and form recessed portions in a vibrating arm. The method includes forming the outward shape of a gyro element from one surface of the quartz crystal substrate using dry etching and forming the recessed portions using wet etching.

8 Claims, 8 Drawing Sheets

(56) References Cited

U.S. PATENT DOCUMENTS

| | | | | |
|---|---|---|---|---|
| 2007/0007864 A1* | 1/2007 | Tanaya | ................. | H03H 9/1021 |
| | | | | 310/367 |
| 2007/0222342 A1* | 9/2007 | Hokibara | ................ | C03C 15/00 |
| | | | | 310/370 |
| 2007/0228895 A1* | 10/2007 | Yamamoto | ............... | H03H 3/02 |
| | | | | 310/365 |
| 2008/0209703 A1* | 9/2008 | Iwai | .......................... | C23F 1/14 |
| | | | | 29/25.35 |
| 2010/0043547 A1* | 2/2010 | Okamoto | ........... | G01C 19/5607 |
| | | | | 73/504.16 |
| 2010/0096953 A1* | 4/2010 | Iwai | .................... | H03H 9/1014 |
| | | | | 310/370 |

FOREIGN PATENT DOCUMENTS

| JP | 2007-013383 A | | 1/2007 |
|---|---|---|---|
| JP | 2010183208 A | * | 8/2010 |
| JP | 2011-244118 A | | 12/2011 |
| JP | 2013-191297 A | | 9/2013 |
| JP | 2013-207332 A | | 10/2013 |

* cited by examiner

VIBRATION ELEMENT MANUFACTURING METHOD, VIBRATION ELEMENT, ELECTRONIC DEVICE, ELECTRONIC APPARATUS, AND MOVING OBJECT

BACKGROUND

1. Technical Field

The present invention relates to a vibration element manufacturing method, a vibration element, an electronic device, an electronic apparatus, and a moving object.

2. Related Art

Hitherto, in order to form the three-dimensional shape or movable structure of a vibration element or the like of an acceleration and angular velocity sensor, micromachining to which a photolithography technique or an etching technique which is a technique for manufacturing a semiconductor device is applied has been used. The outward shape of the vibration element including vibrating arms is formed by etching a substrate using a metal film provided by a photolithography technique and a plating technique as a mask. In addition, when the cross-sectional shapes of the vibrating arms are asymmetric with respect to each other, the vibration element causes a deterioration in vibration characteristics, and thus is required to form the outward shape thereof with a high degree of accuracy. For example, JP-A-2013-207332 discloses a manufacturing method of forming an outward shape of a vibrator element and a recessed portion of a vibrating arm using dry etching. Thereby, it is possible to form the outward shape of the vibrator element with a high degree of accuracy.

However, the use of dry etching allows a high-accuracy outward shape to be formed, but since the film of a metal mask is reduced during the dry etching, it is necessary to form a thick metal mask requiring a more complex process than in a metal mask for wet etching. In the manufacturing method disclosed in JP-A-2013-207332, at least two-times dry etching is required, the number of processes of manufacturing a vibration element increases, and productivity drops, which results in an increase in manufacturing costs. In addition, when the recessed portion is formed using dry etching, product materials generated due to an etching gas, a material to be etched (substrate), and the like are deposited on the inside surface of the recessed portion, which leads to a problem of a drop in yield rate when electrodes are formed in the recessed portion.

SUMMARY

An advantage of some aspects of the invention is to solve at least a part of the problems described above, and the invention can be implemented as the following aspects or application examples.

Application Example 1

A vibration element manufacturing method according to this application example is a vibration element manufacturing method of processing a substrate to form an outward shape of a vibration element including a vibrating arm, and form a recessed portion in the vibrating arm, the method including: forming the outward shape of a vibration element from one surface of the substrate using dry etching; and forming the recessed portion using wet etching.

According to this application example, in the vibration element manufacturing method, the outward shape of a vibration element is formed from one surface of the substrate using dry etching, in the forming of the outward shape. In the forming of the recessed portion, a bottomed recessed portion is formed in the vibrating arm using wet etching. In the manufacturing method of this application example, dry etching capable of formation with a high degree of accuracy is used in the outward shape of a vibration element influencing vibration characteristics, and wet etching is used in the forming of the recessed portion in the vibrating arm. That is, the vibration element is formed using single dry etching and single wet etching, and thus the number of processes of manufacturing of the vibration element is reduced as compared to the related art, and productivity improves. In addition, since product materials are not deposited inside of the formed recessed portion, a yield rate during the formation of electrodes in the recessed portion improves. Therefore, it is possible to improve the yield rate and productivity of the vibration element, and to provide a manufacturing method having a reduction in manufacturing costs.

Application Example 2

In the vibration element manufacturing method according to the application example, it is preferable to further include forming a metal mask corresponding to the outward shape of a vibration element on the substrate before the forming of the outward shape, peeling off the metal mask and forming a pattern corresponding to the recessed portion on the substrate between the forming of the outward shape and the forming of the recessed portion.

According to this application example, the vibration element manufacturing method further includes forming a metal mask for dry etching for forming the outward shape of a vibration element on the substrate before the forming of the outward shape. Further, the vibration element manufacturing method of this application example further includes peeling off the metal mask and forming a pattern for wet etching for forming the recessed portion in the vibrating arm after the forming of the outward shape formation and before the forming of the recessed portion formation. In the manufacturing method of this application example, since the vibration element is formed by the forming of the metal mask for single dry etching and the forming of the pattern for single wet etching, the number of processes of manufacturing a vibration element is reduced and productivity improves, as compared to the related art. Therefore, it is possible to improve the yield rate and productivity of the vibration element, and to provide a manufacturing method having a reduction in manufacturing costs.

Application Example 3 and Application Example 4

In the vibration element manufacturing method according to the application example, it is preferable that the recessed portion is formed on one surface of the substrate and the other surface on the opposite side to the one surface.

According to these application examples, wet etching is used in the forming of the recessed portion in the vibrating arm, and thus it is possible to perform etching from both surfaces of one surface of substrate and the other surface on the opposite side to the one surface. Therefore, it is possible to form a recessed portion on both surfaces of the vibrating arm using single wet etching.

Application Example 5, Application Example 6, Application Example 7, and Application Example 8

A vibration element according to each of these application examples is a vibration element which is manufactured by the manufacturing method according to the application example.

According to these application examples, the vibration element is manufactured by a manufacturing method having an improvement in yield rate and productivity and having a reduction in manufacturing costs, and thus it is possible to provide a vibration element having a reduction in costs.

Application Example 9, Application Example 10, Application Example 11, and Application Example 12

An electronic device according to each of these application examples includes: the vibration element according to the application example; an electronic part including at least a drive circuit that excites the vibrating arm; and a package that receives at least one of the vibration element and the electronic part.

According to this application example, the electronic device includes a vibration element having an improvement in yield rate and productivity and having a reduction in manufacturing costs, and thus it is possible to provide an electronic device having a reduction in costs.

Application Example 13

An electronic apparatus according to this application example includes the vibration element according to the application example.

According to this application example, the electronic apparatus includes a vibration element having an improvement in yield rate and productivity and having a reduction in manufacturing costs, and thus it is possible to provide an electronic apparatus having a reduction in costs.

Application Example 14

A moving object according to this application example includes the vibration element according to the application example.

According to this application example, the moving object includes a vibration element having an improvement in yield rate and productivity and having a reduction in manufacturing costs, and thus it is possible to provide a moving object having a reduction in costs.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of the invention will be described with reference to the accompanying drawings. Meanwhile, in the following each drawing, each layer or each member is set to have a size capable of being recognized, and thus scales of each layer or each member are made different from those in reality. In addition, dimension values described below are illustrative, and can be appropriately changed without departing from the spirit and scope of the invention.

In addition, in FIGS. 1A and 1B and FIGS. 5A and 5B, for convenience of description, an X-axis, a Y-axis and a Z-axis are shown as three axes orthogonal to each other, the tip end side of an arrow showing an axial direction is set to a "+side", and the base end side thereof is set to a "−side". In addition, hereinafter, a direction parallel to the X-axis is defined as an "X-axis direction", a direction parallel to the Y-axis is defined as a "Y-axis direction", and a direction parallel to the Z-axis is defined as a "Z-axis direction".

Embodiment

Shape of Vibration Element

Figure 1A:
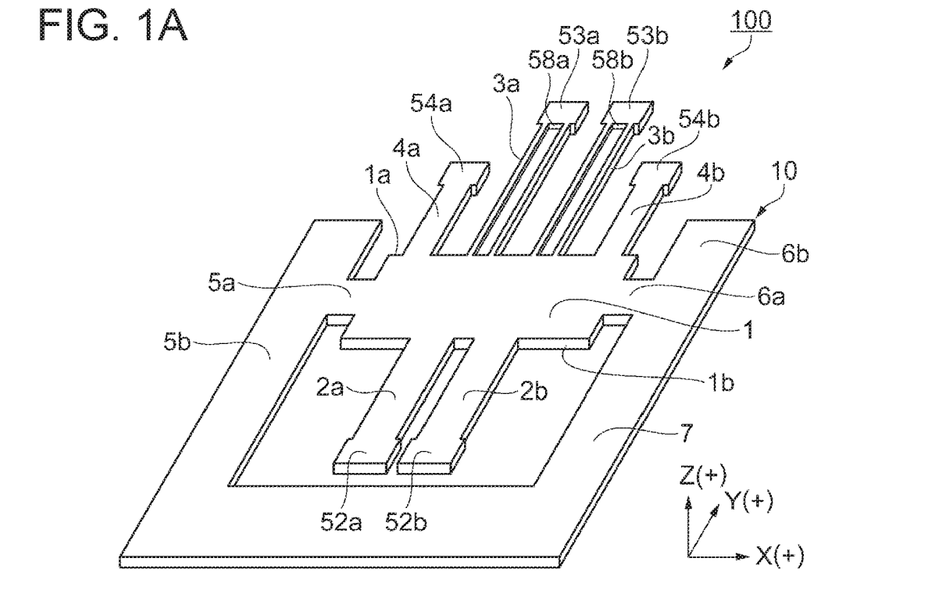
FIG. 1A is a perspective view schematically illustrating a shape of a gyro element as a vibration element.
Figure 1B:
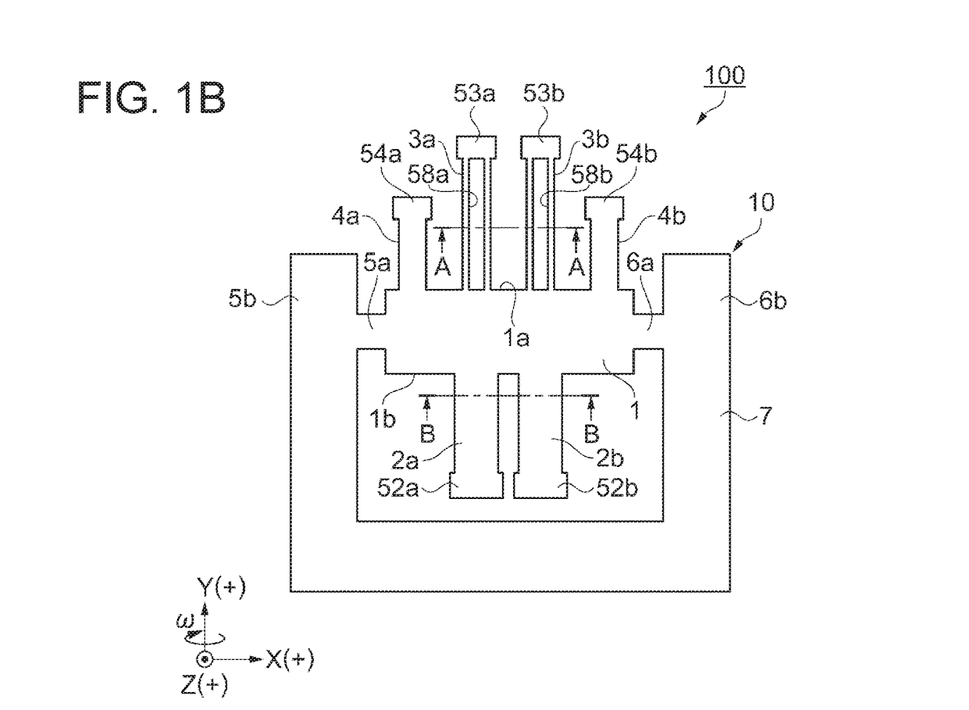
FIG. 1B is a plan view.

First, the shape of a gyro element as a vibration element according to the embodiment will be described with reference to FIGS. 1A and 1B. FIG. 1A is a perspective view schematically illustrating the gyro element. FIG. 1B is a plan view schematically illustrating the gyro element. A gyro element 100 is provided with a detection electrode, a detection wiring, a drive electrode, a drive wiring an adjustment electrode, and the like, but these components are omitted in FIGS. 1A and 1B.

As shown in FIG. 1A, the gyro element 100 according to the embodiment includes a basal portion 1, drive vibrating arms 2a and 2b and detection vibrating arms 3a and 3b serving as vibrating arms, and adjustment vibrating arms 4a and 4b which are integrally formed by processing a substrate (material constituting main portions). Further, the gyro element is provided with a first connecting portion 5a extending out from the basal portion 1, a first support portion 5b connected to the first connecting portion 5a, a second connecting portion 6a extending out from the basal portion 1 in the opposite direction of the first connecting portion 5a, and a second support portion 6b connected to the second connecting portion 6a. Further, the first support portion 5b and the second support portion 6b are integrally connected to each other on the drive vibrating arms 2a and 2b sides, and constitute a fixed frame portion 7. The gyro element 100 is fixed to a substrate such as a package (not shown) at a predetermined position of the fixed frame portion 7.

In the gyro element 100 of the present embodiment, an example will be described in which a quartz crystal substrate 10 which is a piezoelectric material as a substrate is used. A quartz crystal has an X-axis called an electrical axis, a Y-axis called a mechanical axis and a Z-axis called an optical axis. In the present embodiment, an example will be described in which a so-called quartz crystal Z plate which is cut out along a plane specified by the X-axis and the Y-axis orthogonal to each other at a quartz crystal axis and is processed in a flat shape, and has a predetermined thickness in a Z-axis direction orthogonal to the plane is used as a substrate. Meanwhile, the predetermined thickness as used herein is appropriately set by an oscillation frequency (vibration frequency), an outward shape size, workability, and the like. In addition, in a flat plate having the gyro element 100 formed therein, an error of a cutout angle from a quartz crystal can be allowed in a slight range with respect to each of the X-axis, the Y-axis and the Z-axis. For example, a flat plate can be used which is cut out by rotation about the X-axis in a range of 0 degrees to 2 degrees. The same is true of the Y-axis and the Z-axis.

The gyro element 100 includes the substantially rectangular basal portion 1 located at the central portion thereof, a pair of drive vibrating arms 2a and 2b extending out along the Y-axis so as to run parallel from one end (end in a (−)Y-direction in the drawing) 1b of ends 1a and 1b in the Y-axis direction of the basal portion 1, and a pair of detection vibrating arms 3a and 3b extending out so as to run parallel along the Y-axis from the other end (end in a (+)Y-direction in the drawing) 1a on the opposite side to one end 1b of the basal portion 1, using the basal portion 1 as a border. In this manner, the pair of drive vibrating arms 2a and 2b and the pair of detection vibrating arms 3a and 3b extend out coaxially from both ends 1a and 1b of the basal portion 1. From such a shape, the gyro element 100 according to the present embodiment may be called an H-shaped gyro element. The H-shaped gyro element 100 is configured such that the drive vibrating arms 2a and 2b and the detection vibrating arms 3a and 3b extend out from the both ends 1a and 1b of the basal portion 1 in a coaxial direction, respectively, and thus a drive system and a detection system are separated from each other. The gyro element 100 is configured such that the drive system and the detection system are separated from each other in this manner, and thus has a feature that electrostatic coupling between electrodes or wirings of the drive system and the detection system is reduced, and that detection sensitivity is stable. Meanwhile, in the embodiment, two of each of the drive vibrating arms and the detection vibrating arms are provided in an example of the H-shaped gyro element, but the number of vibrating arms may be one or three. In addition, a drive electrode and a detection electrode which are described later may be formed in one vibrating arm.

The H-shaped gyro element 100 is configured such that an angular velocity ω is applied around the Y-axis in a state where the pair of drive vibrating arms 2a and 2b are vibrated in an in-plane direction (+X-axis direction and −X-axis direction), a Coriolis force is generated in the drive vibrating arms 2a and 2b, and that the drive vibrating arms 2a and 2b are flexurally vibrated in an out-of-plane direction (+Z-axis direction and −Z-axis direction) intersecting the in-plane direction, that is, in opposite directions. The detection vibrating arms 3a and 3b vibrate with the flexural vibration of the drive vibrating arms 2a and 2b in the out-of-plane direction, and thus are flexurally vibrated in the out-of-plane direction likewise. In this case, charge is generated in the detection electrodes provided in the detection vibrating arms 3a and 3b due to a piezoelectric effect. The gyro element 100 can detect the angular velocity ω which is applied to the gyro element 100 by detecting the charge.

The pair of drive vibrating arms 2a and 2b extending out from the basal portion 1 are provided with substantially rectangular weight portions 52a and 52b having a width larger (having a dimension in the X-axis direction larger) than that of the drive vibrating arms 2a and 2b, on the other end side of the drive vibrating arms 2a and 2b located on the opposite side to one end side of the basal portion 1. In this manner, the drive vibrating arms 2a and 2b are provided with the weight portions 52a and 52b, and thus it is possible to obtain a predetermined drive vibration while suppressing an increase in the length (dimension in the Y-axis direction) of the drive vibrating arms 2a and 2b. Therefore, it is possible to reduce the size of the gyro element. Meanwhile, the drive vibrating arms 2a and 2b are provided with electrodes for driving the drive vibrating arms 2a and 2b, but the configuration of the electrodes will be described later.

In the pair of detection vibrating arms 3a and 3b extending out from the basal portion 1, bottomed recessed portions 58a and 58b are formed from both surfaces of one surface in the thickness direction (Z-axis direction) of the quartz crystal substrate 10 and the other surface on the opposite side to the one surface. In addition, substantially rectangular weight portions 53a and 53b having a width larger (having a dimension in the X-axis direction larger) than that of the detection vibrating arms 3a and 3b are provided on the other end side of the detection vibrating arms 3a and 3b on the opposite side to one end side of the basal portion 1. In this manner, the detection vibrating arms 3a and 3b are also provided with the weight portions 53a and 53b, and thus it is possible to obtain a predetermined detection vibration while suppressing an increase in the length (dimension in the Y-axis direction) of the detection vibrating arms 3a and 3b. Therefore, it is possible to reduce the size of the gyro element. Meanwhile, the recessed portions 58a and 58b may be configured to be embedded from one surface.

Further, as shown in FIGS. 1A and 1B, the gyro element 100 is provided with a pair of adjustment vibrating arms 4a and 4b extending out from the basal portion 1 so as to be caused to run parallel to the detection vibrating arms 3a and 3b in a direction intersecting the crystal X-axis (electrical axis) of a quartz crystal and to interpose the detection vibrating arms 3a and 3b therebetween. That is, the adjustment vibrating arms 4a and 4b are provided so as to extend out in the (+) Y-axis direction along the Y-axis, be located to be interposed inside at a predetermined distance from the detection vibrating arms 3a and 3b, and to run parallel to each other. Meanwhile, the adjustment vibrating arms 4a and 4b may also be called tuning arms. Such adjustment vibrating arms 4a and 4b are provided, and thus it is possible to adjust a leakage output. In other words, charge generated in the detection vibrating arms 3a and 3b by a so-called vibration leakage output in which a drive vibration leaks (propagates) can be offset by charge generated in the adjustment vibrating arms 4a and 4b.

In addition, the adjustment vibrating arms 4a and 4b are formed so as to have the entire length shorter than those of the drive vibrating arms 2a and 2b and the detection vibrating arms 3a and 3b. Thereby, since a case does not occur in which the vibration of the adjustment vibrating arms 4a and 4b for adjusting a leakage output disturbs the main vibration of the gyro element 100 due to the drive vibrating arms 2a and 2b and the detection vibrating arms 3a and 3b, the vibration characteristics of the gyro element 100 are stable, and there is an advantage to a reduction in the size of the gyro element 100.

Further, substantially rectangular weight portions 54a and 54b having a width larger (having a length in the X-axis direction larger) than that of the adjustment vibrating arms 4a and 4b are provided on the other end side of the adjustment vibrating arms 4a and 4b on the opposite side to one end side of the basal portion 1. In this manner, the tip end portions of the adjustment vibrating arms 4a and 4b are provided with the weight portions 54a and 54b, respectively, and thus it is possible to increase the amount of adjustment performed by the adjustment vibrating arms 4a and 4b, and to further improve an effect contributing to an improvement in the sensitivity of the gyro element 100.

The center of the basal portion 1 can be set to the centroid of the gyro element 100. The X-axis, the Y-axis and the Z-axis are assumed to be orthogonal to each other, and pass through the centroid. The outward shape of the gyro element 100 can be set to be line-symmetric with respect to a virtual central line passing through the centroid in the Y-axis direction. Thereby, the outward shape of the gyro element 100 has a satisfactory balance, the characteristics of the gyro element 100 are stable, and detection sensitivity improves, which leads to a preferable result.

Such an outward shape of the gyro element 100 can be formed by etching using a photolithography technique. In addition, a plurality of gyro elements 100 can be obtained from one quartz crystal substrate 10.

Method of Manufacturing Vibration Element

Figure 2:
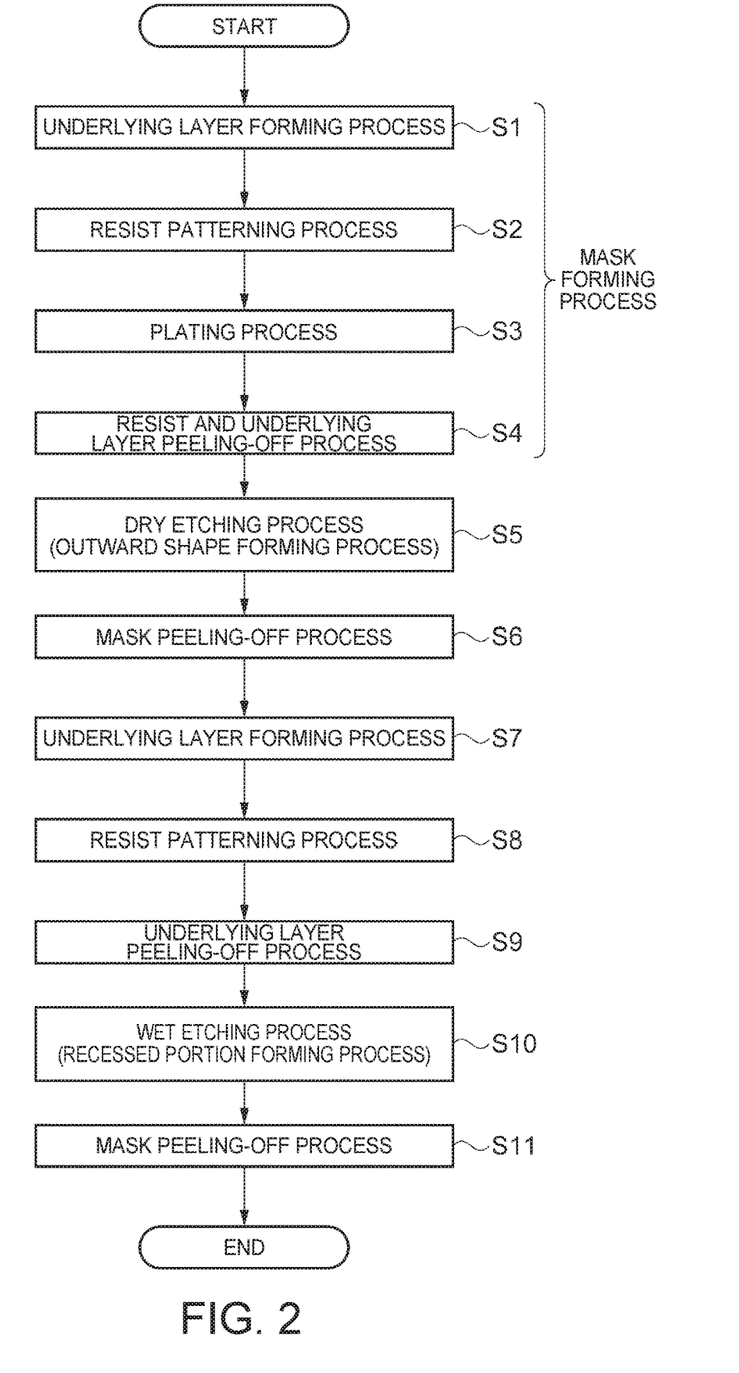
FIG. 2 is a process diagram illustrating a manufacturing method of forming an outward shape of the gyro element and forming a recessed portion in a vibrating arm.

Next, reference will be made to FIG. 2 to FIGS. 4G to 4K to describe a manufacturing method of processing the quartz crystal substrate 10 to form the outward shape of the gyro element 100 having the vibrating arms and form the recessed portions 58a and 58b in the detection vibrating arms 3a and 3b. FIG. 2 is a process diagram illustrating a manufacturing method of forming the outward shape of the gyro element and forming the recessed portion in the vibrating arm. FIGS. 3A to 3F are cross-sectional views taken along line A-A in FIG. 1B for each main process. FIGS. 4G to 4K are cross-sectional views taken along line A-A in FIG. 1B for each main process.

Figure 3A:
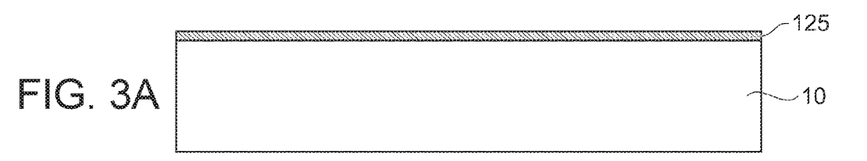
FIGS. 3A to 3F are cross-sectional view taken along line A-A in FIG. 1B for each main process.

First, in an underlying layer forming process of step S1, an underlying layer 125 is formed on the quartz crystal substrate 10. FIG. 3A is a cross-sectional view after the underlying layer 125 is formed on the quartz crystal substrate 10. The underlying layer 125 can be formed by a sputtering method, a chemical vapor deposition (CVD) method, an electroless plating method, or the like. Examples of materials of the underlying layer 125 to be used may include gold (Au), copper (Cu), titanium tungsten (TiW), chromium (Cr), nickel chrome (NiCr), aluminum (Al), and the like. An adhesion layer (not shown) for increasing adhesion between the quartz crystal substrate 10 and the underlying layer 125 may be provided. In the present embodiment, the underlying layer 125 having a thickness of approximately 100 nm is formed of copper (Cu) on the quartz crystal substrate 10 with an adhesion layer of chromium (Cr) interposed therebetween.

Figure 3B:
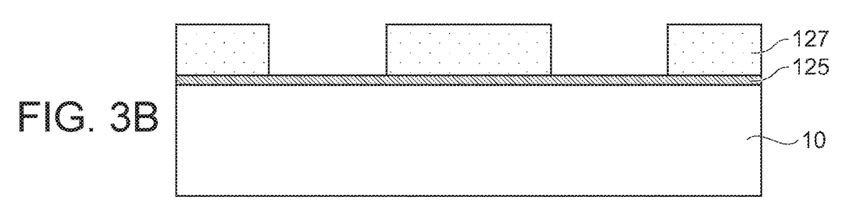

In a resist patterning process of step S2, a resist is patterned using photolithography. FIG. 3B is a cross-sectional view after patterning. The resist is applied uniformly onto the surface of the quartz crystal substrate 10 with a thickness of approximately 25 μm, for example, using a coater or the like. The resist applied to the quartz crystal substrate 10 is exposed through a photomask (not shown) using an exposure device such as, for example, a contact aligner or a proximity aligner. Thereafter, the resist is developed, and thus a resist pattern 127 which is open to the shape of the gyro element 100 when seen in a plan view is formed.

Figure 3C:
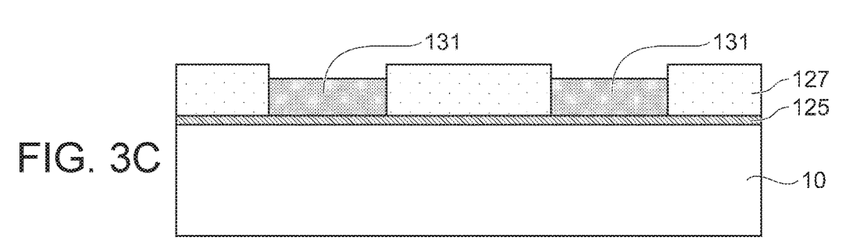

In plating process of step S3, a metal layer 131 serving as a mask during the formation of the gyro element 100 by etching the quartz crystal substrate 10 is formed. FIG. 3C is a cross-sectional view after the metal layer 131 is formed. The metal layer 131 can be formed by a plating technique on the underlying layer 125 which is exposed using the resist pattern 127 as a mask. The metal layer 131 of the present embodiment is formed with a thickness of approximately 15 μm by processing nickel (Ni) using an electroless plating method.

Figure 3D:
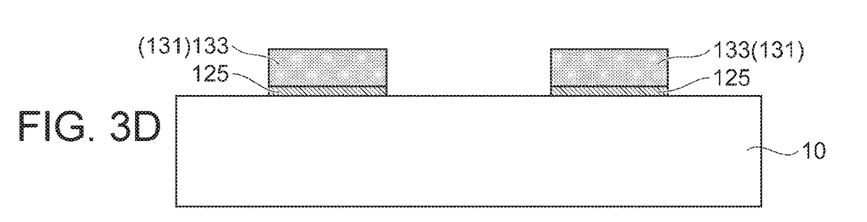

In a resist and underlying layer peeling-off process of step S4, a metal mask 133 is formed by removing the resist pattern 127 and the underlying layer 125. FIG. 3D is a cross-sectional view after the resist pattern 127 and the underlying layer 125 are peeled off. The metal mask 133 is formed by peeling off the resist pattern 127 which is used as a mask of the underlying layer 125 in a plating process and is no longer required, and removing the exposed underlying layer 125. As a method of peeling off the resist pattern 127, a wet etching method using a resist peeling agent, a dry etching method using ozone or plasma, and the like can be used. As a method of peeling off the underlying layer 125, a dry etching method using a reactive gas or the like reacting to a material used in the underlying layer 125, a wet etching method of immersing the material used in the underlying layer 125 in a liquid for corrosion and dissolution, and the like can be used. Meanwhile, a mask forming process of forming the metal mask 133 on the quartz crystal substrate 10 refers to processes from the underlying layer forming process of step S1 to the resist and underlying layer peeling-off process of step S4.

Figure 3E:
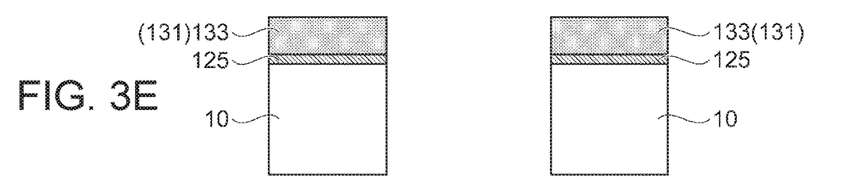

In a dry etching process as an outward shape forming process of step S5, the quartz crystal substrate 10 is etched using the metal mask 133 as a mask. FIG. 3E is a cross-sectional view after the quartz crystal substrate 10 is etched. The dry etching process is an outward shape forming process of forming the outward shape of the gyro element 100 from one surface of the quartz crystal substrate 10, using dry etching. The quartz crystal substrate 10 is etched by a dry etching method using a fluorine-based gas such as, for example, $CF_4$ (carbon tetrafluoride) as a reactive gas.

Figure 3F:
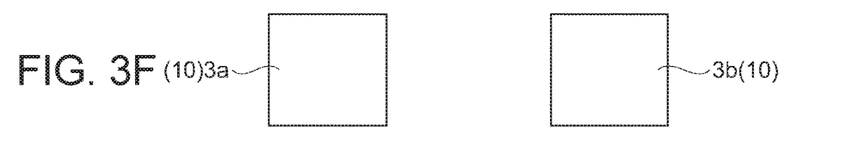

In a mask peeling-off process of step S6, the metal mask 133 and the underlying layer 125 which are used as a mask in the dry etching process and are no longer required are peeled off. FIG. 3F is a cross-sectional view after the metal mask 133 and the underlying layer 125 are peeled off. The metal mask 133 and the underlying layer 125 are peeled off by the wet etching method. The outward shape (in FIGS. 3A to 3F, the pair of detection vibrating arms 3a and 3b) of the gyro element 100 is formed through the above-mentioned processes. The outward shape of the gyro element 100 is formed by dry etching from one surface of the quartz crystal substrate 10, and thus it is possible to form the outward shape with a high degree of accuracy. Thereby, the cross-section of the drive vibrating arms 2a and 2b taken along line B-B in FIG. 1B is formed in a symmetrical shape having both substantially vertical lateral sides, and thus it is possible to reduce an oblique vibration including displacement in the out-of-plane direction (+Z-axis direction and −Z-axis direction) occurring when the drive vibrating arms 2a and 2b are driven.

Subsequently, a description will be given of a manufacturing method of forming the recessed portions 58a and 58b in the detection vibrating arms 3a and 3b from both surfaces of one surface quartz crystal substrate 10 and the other surface on the opposite side to the one surface.

Figure 4G:
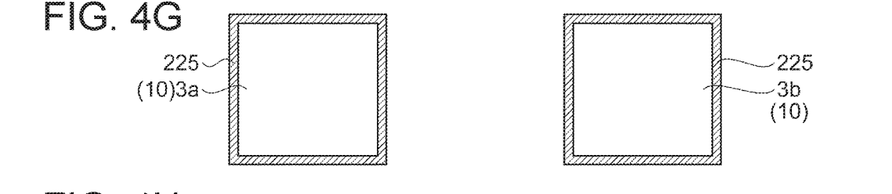
FIGS. 4G to 4K are cross-sectional views taken along line A-A in FIG. 1B for each main process.

In an underlying layer forming process of step S7, an underlying layer 225 is formed on the outer circumference of the detection vibrating arms 3a and 3b. FIG. 4G is a cross-sectional view after the underlying layer 225 is formed on the outer circumference of the detection vibrating arms 3a and 3b. The underlying layer 225 can be formed by a sputtering method, a chemical vapor deposition (CVD)

method, an electroless plating method, or the like. Examples of materials of the underlying layer 225 to be used may include gold (Au), copper (Cu), titanium tungsten (TiW), chromium (Cr), nickel chrome (NiCr), aluminum (Al), and the like. An adhesion layer (not shown) for increasing adhesion between the quartz crystal (detection vibrating arms 3a and 3b) and the underlying layer 225 may be provided. In the present embodiment, the underlying layer 225 having a thickness of approximately 65 nm is formed of gold (Au) on the outer circumference of the detection vibrating arms 3a and 3b with an adhesion layer of chromium (Cr) interposed therebetween.

Figure 4H:
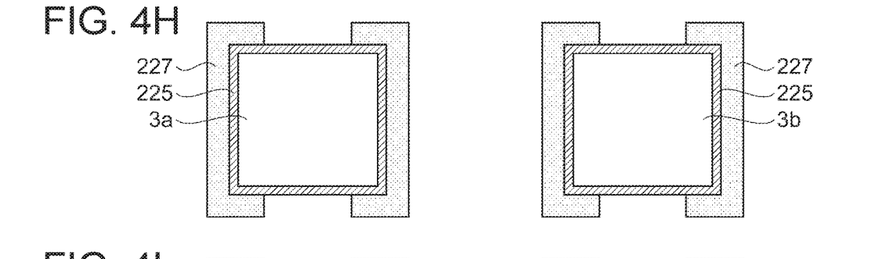

In a resist patterning process of step S8, a resist is patterned using photolithography. FIG. 4H is a cross-sectional view after patterning. The resist is applied onto the entire surface on the outer circumference of the detection vibrating arms 3a and 3b, for example, using a spray coating method or the like. The resist applied to the detection vibrating arms 3a and 3b is exposed through a photomask (not shown) using an exposure device such as, for example, a double-sided aligner. Thereafter, the resist is developed, and thus a resist pattern 227 which is open to the shape of the recessed portions 58a and 58b when seen in a plan view is formed.

Figure 4I:
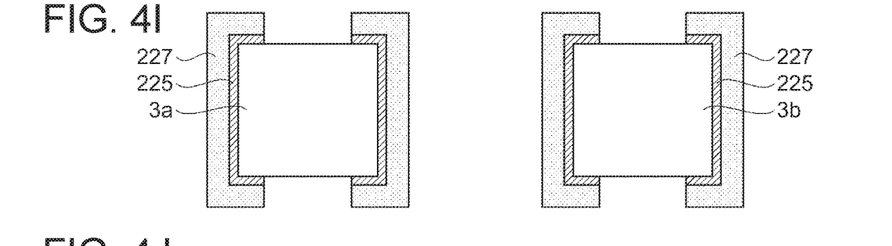

In an underlying layer peeling-off process of step S9, the surface of the detection vibrating arms 3a and 3b (quartz crystal) for forming the recessed portions 58a and 58b by removing the underlying layer 225 exposed by the development of the resist is exposed. FIG. 4I is a cross-sectional view after the underlying layer 225 is peeled off. As a method of peeling off the underlying layer 225, a dry etching method using a reactive gas or the like reacting to a material used in the underlying layer 225, a wet etching method of immersing the material used in the underlying layer 225 in a liquid for corrosion and dissolution, and the like can be used.

Figure 4J:
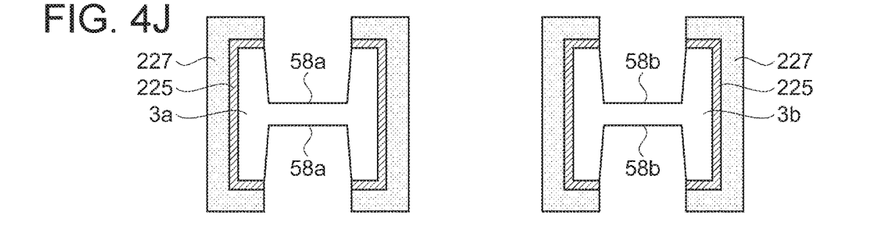

In a wet etching process of step S10, the detection vibrating arms 3a and 3b (quartz crystal) are etched using the resist pattern 227 and underlying layer 225 as a mask. FIG. 4J is a cross-sectional view after the detection vibrating arms 3a and 3b are etched. The wet etching process is a recessed portion forming process of forming the recessed portions 58a and 58b in the detection vibrating arms 3a and 3b, using wet etching. The quartz crystal (detection vibrating arms 3a and 3b) can be wet-etched using, for example, a hydrofluoric acid (HF), a mixed solution containing the hydrofluoric acid as a main component, or the like.

Figure 4K:
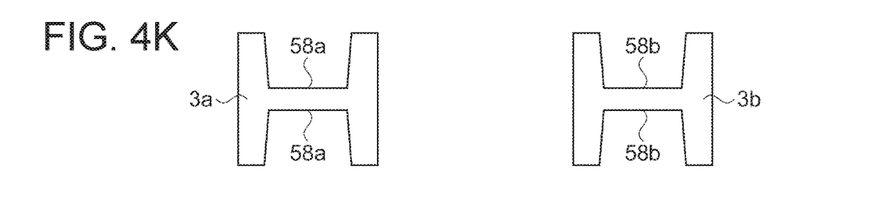

In a mask peeling-off process of step S11, the resist pattern 227 and the underlying layer 225 which are used as a mask in the wet etching process and are no longer required are peeled off. FIG. 4K is a cross-sectional view after the resist pattern 227 and the underlying layer 225 are peeled off. The resist pattern 227 and the underlying layer 225 are peeled off by a wet etching method. The recessed portions 58a and 58b are formed on both surfaces of the detection vibrating arms 3a and 3b through the above-mentioned processes of step S7 to step S11. The gyro element 100 as a vibration element is manufactured by the manufacturing method described in step S1 to step S11.

In order to form a recessed portion on both surfaces of a vibrating arm using dry etching of the related art, a mask forming process of forming a metal mask and a process equivalent to a dry etching process are required to be repeated twice. However, in the gyro element 100 of the present embodiment, the recessed portions 58a and 58b are formed by wet etching, and thus it is possible to simultaneously form the recessed portions 58a and 58b on both surfaces of the detection vibrating arms 3a and 3b through a single process. In addition, even in a vibration element having a recessed portion formed on the single surface thereof, wet etching does not need a thick metal mask requiring a plating process as in dry etching, and thus it is possible to form the recessed portion through a process easier than the dry etching.

In addition, such product materials generated due to an etching gas, a material to be etched, and the like as those when formed by dry etching are not deposited on the inside surfaces of the recessed portions 58a and 58b. Further, the inside surfaces of the recessed portions 58a and 58b have inclinations with opening surfaces wider than those of the inner bottoms of the recessed portions 58a and 58b. Thereby, it is possible to easily form detection electrodes described later on the inside surfaces of the recessed portions 58a and 58b.

Electrode Configuration of Vibration Element

Figure 5A:
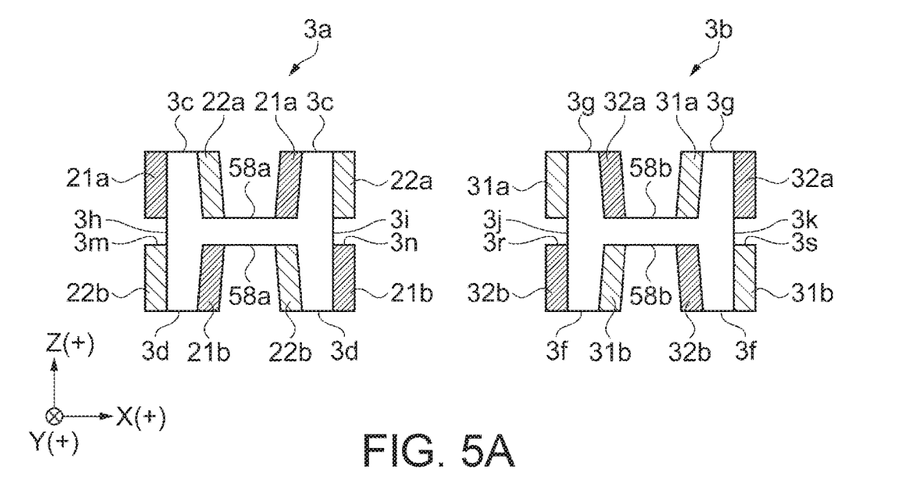
FIG. 5A is a cross-sectional view taken along line A-A in FIG. 1B illustrating an electrode configuration of the gyro element.
Figure 5B:
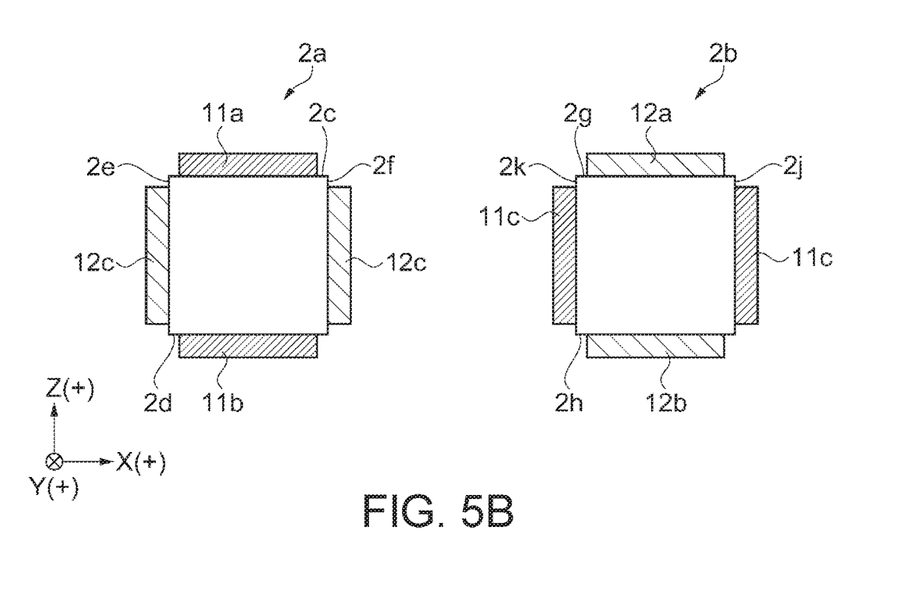
FIG. 5B is a cross-sectional view taken along line B-B in FIG. 1B.

Next, an embodiment of the electrode arrangement of the gyro element 100 will be described with reference to FIGS. 5A and 5B. FIG. 5A is a cross-sectional view taken along line A-A in FIG. 1B for illustrating the electrode configuration of the gyro element. FIG. 5B is a cross-sectional view taken along line B-B in FIG. 1B.

First, a description will be given of detection electrodes, formed in the detection vibrating arms 3a and 3b, which detect distortion generated in a quartz crystal which is a substrate by the vibration of the detection vibrating arms 3a and 3b. As shown in FIG. 5A, the pair of detection vibrating arms 3a and 3b include surfaces 3c and 3g, rear surfaces 3d and 3f which are provided on the opposite side to the surfaces 3c and 3g, and lateral sides 3h, 3i, 3j, and 3k that connect the surfaces 3c and 3g to the rear surfaces 3d and 3f. In addition, as described above, the recessed portions 58a and 58b are formed in the detection vibrating arms 3a and 3b from both surfaces of one surface and the other surface on the opposite side to the one surface. Specifically, the recessed portions 58a and 58b in the present embodiment are provided on both surfaces of the surfaces 3c and 3g and the rear surfaces 3d and 3f.

The detection vibrating arm 3a is provided with first detection electrodes 21a and 21b and second detection electrodes 22a and 22b which are serve as detection electrodes.

Specifically, the lateral side 3h of the detection vibrating arm 3a is provided with the first detection electrode 21a on the surface 3c side and the second detection electrode 22b on the rear surface 3d side which are divided by an electrode division portion 3m located at substantially the center of the detection vibrating arm 3a in a thickness direction (Z-axis direction) and provided along the extending-out direction (Y-axis direction) of the detection vibrating arm 3a. Further, the second detection electrode 22a is provided on the inside surface of the recessed portion 58a facing the first detection electrode 21a, and the first detection electrode 21b is provided on the inside surface of the recessed portion 58a facing the second detection electrode 22b. In addition, the lateral side 3i on the opposite side to the lateral side 3h is provided with the second detection electrode 22a on the surface 3c side and the first detection electrode 21b on the rear surface 3d side which are divided by an electrode division portion 3n located at substantially the center of the detection vibrating arm 3a in a thickness direction and provided along the extending-out direction of the detection vibrating arm 3a. Further, the first detection electrode 21a is provided on the inside surface of the recessed portion 58a facing the second detection electrode 22a, and the second detection electrode 22b is provided on the inside surface of the recessed portion 58a facing the first detection electrode 21b.

The first detection electrode 21a and the first detection electrode 21b are electrically connected to each other through the tip end portion (not shown) of the detection vibrating arm 3a, or the like. The second detection electrode 22a and the second detection electrode 22b are electrically connected to each other through the tip end portion (not shown) of the detection vibrating arm 3a, or the like. Meanwhile, the first detection electrodes 21a and 21b and the second detection electrodes 22a and 22b extend up to the vicinity of the tip end of the detection vibrating arm 3a. In addition, the first detection electrodes 21a and 21b and the second detection electrodes 22a and 22b are electrically connected to external connection pads (not shown), respectively, through wirings (not shown). In addition, the first detection electrodes 21a and 21b and the second detection electrodes 22a and 22b are also electrically connected to adjustment electrodes (not shown) formed in the adjustment vibrating arm 4a (see FIGS. 1A and 1B).

Simultaneously, the detection vibrating arm 3b is provided with first detection electrodes 32a and 32b and second detection electrodes 31a and 31b which serve as detection electrodes.

Specifically, the lateral side 3j of the detection vibrating arm 3b is provided with the second detection electrode 31a on the surface 3g side and the first detection electrode 32b on the rear surface 3f side which are divided by an electrode division portion 3r located at substantially the center of the detection vibrating arm 3b in a thickness direction (Z-axis direction) and provided along the extending-out direction (Y-axis direction) of the detection vibrating arm 3b. Further, the first detection electrode 32a is provided on the inside surface of the recessed portion 58b facing the second detection electrode 31a, and the second detection electrode 31b is provided on the inside surface of the recessed portion 58b facing the first detection electrode 32b. In addition, the lateral side 3k on the opposite side to the lateral side 3j is provided with the first detection electrode 32a on the surface 3g side and the second detection electrode 31b on the rear surface 3f side which are divided by an electrode division portion 3s located at substantially the center of the detection vibrating arm 3b in a thickness direction and provided along the extending-out direction of the detection vibrating arm 3b. Further, the second detection electrode 31a is provided on the inside surface of the recessed portion 58b facing the first detection electrode 32a, and the first detection electrode 32b is provided on the inside surface of the recessed portion 58b facing the second detection electrode 31b.

The second detection electrode 31a and the second detection electrode 31b are electrically connected to each other through the tip end portion (not shown) of the detection vibrating arm 3b, or the like. The first detection electrode 32a and the first detection electrode 32b are electrically connected to each other through the tip end portion (not shown) of the detection vibrating arm 3b, or the like. Meanwhile, the second detection electrodes 31a and 31b and the first detection electrodes 32a and 32b extend up to the vicinity of the tip end of the detection vibrating arm 3b. In addition, the second detection electrodes 31a and 31b and the first detection electrodes 32a and 32b are electrically connected to external connection pads (not shown), respectively, through wirings (not shown). In addition, the second detection electrodes 31a and 31b and the first detection electrodes 32a and 32b are also electrically connected to adjustment electrodes (not shown) formed in the adjustment vibrating arm 4b (see FIGS. 1A and 1B).

In the detection vibrating arm 3a, the first detection electrode 21a and the first detection electrode 21b are connected to each other so as to have the same potential, and the second detection electrode 22a and the second detection electrode 22b are connected to each other so as to have the same potential. Thereby, distortion occurring due to the vibration of the detection vibrating arm 3a is detected by detecting a potential difference between the electrodes of the first detection electrodes 21a and 21b and the second detection electrodes 22a and 22b. Similarly, in the detection vibrating arm 3b, the first detection electrode 32a and the first detection electrode 32b are connected to each other so as to have the same potential, and the second detection electrode 31a and the second detection electrode 31b are connected to each other so as to have the same potential. Thereby, distortion occurring due to the vibration of the detection vibrating arm 3b is detected by detecting a potential difference between the electrodes of the first detection electrodes 32a and 32b and the second detection electrodes 31a and 31b.

Next, a description will be given of drive electrodes 11a, 11b, 11c, 12a, 12b, and 12c, provided in the drive vibrating arms 2a and 2b, for driving the drive vibrating arms 2a and 2b. As shown in FIG. 5B, the pair of drive vibrating arms 2a and 2b include surfaces 2c and 2g, rear surfaces 2d and 2h which are provided on the opposite side to the surfaces 2c and 2g, and lateral sides 2e, 2f, 2k, and 2j that connect the surfaces 2c and 2g to the rear surfaces 2d and 2h. The drive electrode 11a is formed on the surface (one main surface) 2c of the drive vibrating arm 2a and the drive electrode 11b is formed on the rear surface (the other main surface) 2d, up to the weight portion 52a (see FIGS. 1A and 1B). In addition, the drive electrodes 12c are formed on one lateral side 2e and the other lateral side 2f of the drive vibrating arm 2a, up to the weight portion 52a (see FIGS. 1A and 1B) of the drive vibrating arm 2a. Similarly, the drive electrode 12a is formed on the surface (one main surface) 2g of the drive vibrating arm 2b and the drive electrode 12b is formed on the rear surface (the other main surface) 2h, up to the weight portion 52b (see FIGS. 1A and 1B). In addition, the drive electrodes 11c are formed on one lateral side 2j and the other lateral side 2k of the drive vibrating arm 2b, up to the weight portion 52b (see FIGS. 1A and 1B) of the drive vibrating arm 2b.

The drive electrodes 11a, 11b, and 11c, 12a, 12b, and 12c which are formed in the drive vibrating arms 2a and 2b are disposed so as to have the same potential between the drive electrodes disposed facing each other with the drive vibrating arms 2a and 2b interposed therebetween. In addition, although not shown in the drawing, the drive vibrating arms 2a and 2b have a so-called tuning fork vibration excited therein by alternately giving a potential difference between the drive electrodes 11a, 11b, and 11c and the drive electrodes 12a, 12b, and 12c through a connection pad formed in a first fixed portion to which the drive electrodes 11a, 11b, and 11c are connected and a connection pad formed in a second fixed portion to which the drive electrodes 12a, 12b, and 12c are connected.

Next, electrodes provided in the adjustment vibrating arms 4a and 4b will be described. The adjustment vibrating arm 4a has adjustment electrodes (not shown) having the same potential formed on the front and rear surfaces thereof. In addition, other adjustment electrodes having the same potential are formed on each of both lateral sides of the adjustment vibrating arm 4a. Similarly, the adjustment vibrating arm 4b has adjustment electrodes having the same potential formed on the front and rear surfaces thereof. In addition, other adjustment electrodes having the same potential are formed on both lateral sides of the adjustment vibrating arm 4b.

Meanwhile, the configurations of the drive electrodes 11a, 11b, and 11c, 12a, 12b, and 12c, the first detection electrodes 21a, 21b, 32a, and 32b, the second detection electrodes 22a, 22b, 31a, and 31b, and the adjustment electrodes have conductive properties without being particularly limited, and may be configured to be capable of being formed to be thin. As a specific configuration, these electrodes can be formed by, for example, metal materials such as gold (Au), gold alloy, platinum (Pt), aluminum (Al), an aluminum alloy, silver (Ag), silver alloy, chromium (Cr), a chromium alloy, copper (Cu), molybdenum (Mo), niobium (Nb), tungsten (W), iron (Fe), titanium (Ti), cobalt (Co), zinc (Zn), or zirconium (Zr), conductive materials such as an indium tin oxide (ITO), and the like.

As described above, according to the vibration element manufacturing method of the present embodiment and the vibration element, the following effects can be obtained.

The gyro element 100 as the vibration element of the present embodiment is manufactured by the manufacturing method including the mask forming process of forming the metal mask 133 on the quartz crystal substrate 10, the outward shape forming process of forming the outward shape of the gyro element 100 from one surface of the quartz crystal substrate 10 using dry etching, and the recessed portion forming process of forming the recessed portions 58a and 58b using wet etching.

The detection vibrating arms 3a and 3b of the gyro element 100 has the recessed portions 58a and 58b formed on both surfaces thereof. The recessed portions 58a and 58b are formed by wet etching, and thus it is possible to simultaneously form the recessed portions 58a and 58b on both surfaces of the detection vibrating arms 3a and 3b through a single process. In addition, even in a vibration element having a recessed portion formed on the single surface thereof, a mask for wet etching can be formed in a process easier than that in which a metal mask for dry etching is formed, and thus it is possible to improve the productivity of the gyro element 100.

In addition, since the recessed portions 58a and 58b are formed by wet etching, such product materials as those when the recessed portion is formed by dry etching are not deposited on the inside surfaces of the recessed portions 58a and 58b. Further, since the inside surfaces of the recessed portions 58a and 58b have inclinations with opening surfaces wider than those of the inner bottoms of the recessed portions 58a and 58b, it is possible to easily form detection electrodes on the inside surfaces of the recessed portions 58a and 58b. Thereby, it is possible to improve the yield rate of the gyro element 100. Therefore, it is possible to provide a manufacturing method having an improvement in the yield rate and productivity of the gyro element 100 and having a reduction in manufacturing costs. In addition, the gyro element 100 is manufactured by the manufacturing method having an improvement in the yield rate and productivity thereof and a reduction in manufacturing costs, and thus it is possible to provide the gyro element 100 having a reduction in manufacturing costs.

Gyro Sensor as Electronic Device

Figure 6:
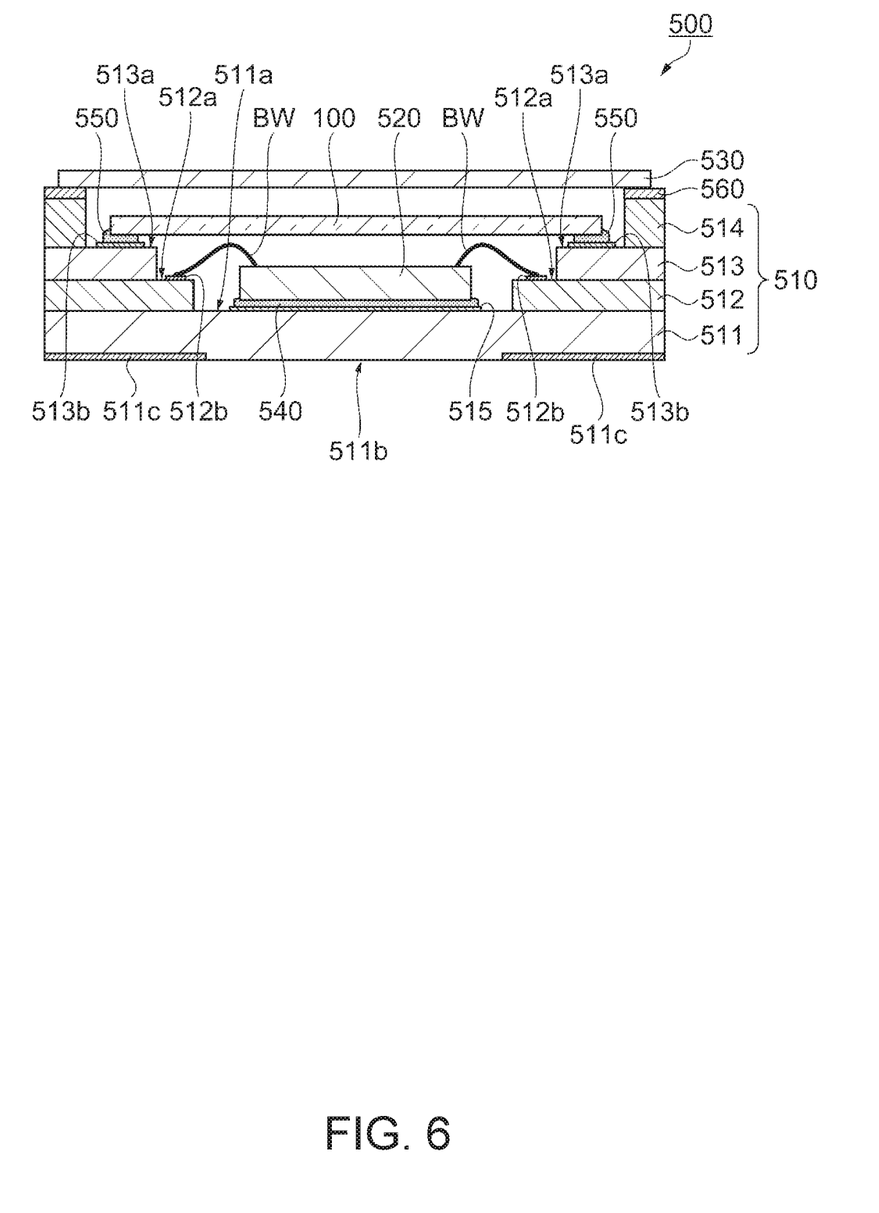
FIG. 6 is a front cross-sectional view illustrating a schematic configuration of a gyro sensor as an example of an electronic device according to the invention.

Next, a gyro sensor 500 as an electronic device including the gyro element 100 according to the embodiment will be described with reference to FIG. 6. FIG. 6 is a front cross-sectional view illustrating a schematic configuration of a gyro sensor as an example of an electronic device.

As shown in FIG. 6, the gyro sensor 500 is configured to receive the gyro element 100 and a semiconductor device 520 as an electronic part in a recessed portion of the package 510, have an opening of the package 510 closed hermetically by a lid 530, and to have the inside thereof held air-tightly. The package 510 is configured to include a first substrate 511 having a flat shape, and a frame-like second substrate 512, a third substrate 513, and fourth substrate 514 which are laminated in order on the first substrate 511 and are fixedly formed, and to have a recessed portion for receiving the semiconductor device 520 and the gyro element 100 formed therein. The substrates 511, 512, 513, and 514 are formed of, for example, ceramics or the like.

A die pad 515 on which the semiconductor device 520 is placed fixed is provided on an electronic part mounting surface 511a of the first substrate 511 facing the recessed portion on which the semiconductor device 520 is mounted. The semiconductor device 520 is bonded and fixed onto the die pad 515 by, for example, a brazing filler metal (die attaching material) 540.

The semiconductor device 520 includes a drive circuit as an excitation unit for driving and vibrating the gyro element 100, and a detection circuit as a detection unit for detecting a detection vibration occurring in the gyro element 100 when an angular velocity is applied. Specifically, the drive circuit included in the semiconductor device 520 supplies drive signals to the drive electrodes 11a, 11b, and 12c and the drive electrodes 11c, 12a, and 12b (see FIGS. 5A and 5B) which are respectively formed in the pair of drive vibrating arms 2a and 2b (see FIGS. 1A and 1B) of the gyro element 100. In addition, the detection circuit included in the semiconductor device 520 amplifies detection signals occurring in the first detection electrodes 21a and 21b, the second detection electrodes 22a and 22b, and the second detection electrodes 31a and 31b, the first detection electrodes 32a and 32b (see FIGS. 5A and 5B) which are respectively formed in the pair of detection vibrating arms 3a and 3b of the gyro element 100 to thereby generate the amplified signals, and detects a rotation angular velocity which is applied to the gyro sensor 500 on the basis of the amplified signals.

The second substrate 512 is formed in a frame-like shape having an opening of a size capable of receiving the semiconductor device 520 which is mounted on the die pad 515. The third substrate 513 is formed in a frame-like shape having an opening wider than the opening of the second substrate 512, is laminated on the second substrate 512, and is fixed thereto. A plurality of IC connection terminals 512b to which bonding wires BW electrically connected to electrode pads (not shown) of the semiconductor device 520 are connected are formed on a second substrate surface 512a appearing on the inside of the opening of the third substrate 513 by the third substrate 513 being laminated on the second substrate 512. The electrode pads (not shown) of the semiconductor device 520 and the IC connection terminals 512b provided in the package 510 are electrically connected to each other using a wire bonding method. That is, a plurality of electrode pads provided in the semiconductor device 520 and the corresponding IC connection terminals 512b of the package 510 are connected to each other by the bonding wires BW. In addition, any of the IC connection terminals 512b is electrically connected to a plurality of external connection terminals 511c provided in an external bottom 511b of the first substrate 511 by internal wirings (not shown) of the package 510.

The fourth substrate 514 having an opening wider than the opening of the third substrate 513 is laminated on the third substrate 513, and is fixed thereto. A plurality of gyro element connection terminals 513b which are connected to connection pads (not shown) formed in the gyro element 100 are formed on a third substrate surface 513a appearing on the inside of the opening of the fourth substrate 514 by the fourth substrate 514 being laminated on the third substrate 513. The gyro element connection terminals 513b are electrically connected to any of the IC connection terminals 512b by internal wirings (not shown) of the package 510. The gyro element 100 is placed on the third substrate surface 513a by aligning the first support portion 5b and the second support portion 6b (see FIGS. 1A and 1B) of the gyro element 100 with the connection pads and the gyro element connection terminals 513b, and is adhesively fixed to the connection pads and the connection terminals by conductive adhesives 550.

Further, the lid 530 is disposed on the upper surface of the opening of the fourth substrate 514, and the inside of the package 510 is hermetically sealed by sealing the opening of the package 510, whereby the gyro sensor 500 is obtained. The lid 530 can be formed using, for example, a metal such as a 42 alloy (alloy containing nickel of 42% in iron) or Kovar (alloy of iron, nickel and cobalt), ceramics, glass, and the like. For example, when the lid 530 is formed of a metal, the lid is bonded to the package 510 by performing seam welding through a seal ring 560 which is formed by shearing a Kovar alloy or the like in a rectangular ring shape. The space of the recessed portion which is formed by the package 510 and the lid 530 serves as a space in order for the gyro element 100 to operate, and thus is preferably hermetically closed and sealed in a decompression space or an inert gas atmosphere.

Since the gyro sensor 500 as an electronic device reduces costs, and includes the gyro element 100 having desired detection sensitivity, it is possible to provide the gyro sensor 500 having predetermined detection sensitivity as a low cost. In addition, the gyro sensor 500 of a package type such as the configuration is advantageous to a reduction in size and thickness, and can increase an impact resistance.

Meanwhile, in addition to the gyro sensor 500, an electronic device to which the vibration element according to the invention can be applied includes, for example, a vibrator as a timing device having the vibration element housed within the package, an oscillator as a timing device having a circuit element including at least an vibration element and a function of vibrating the vibration element housed within the package, or the like.

Electronic Apparatus

Figure 7A:
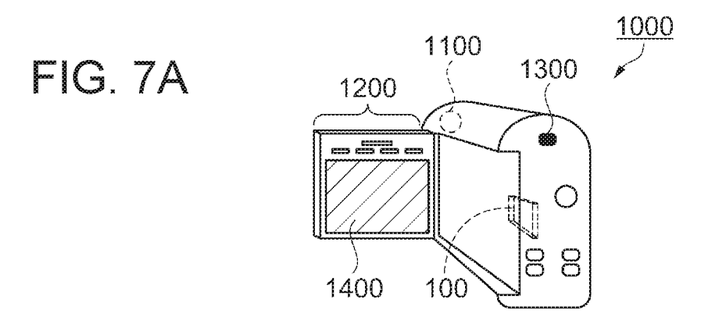
FIGS. 7A to 7C are perspective view illustrating an example of an electronic apparatus including the vibration element.
Figure 7B:
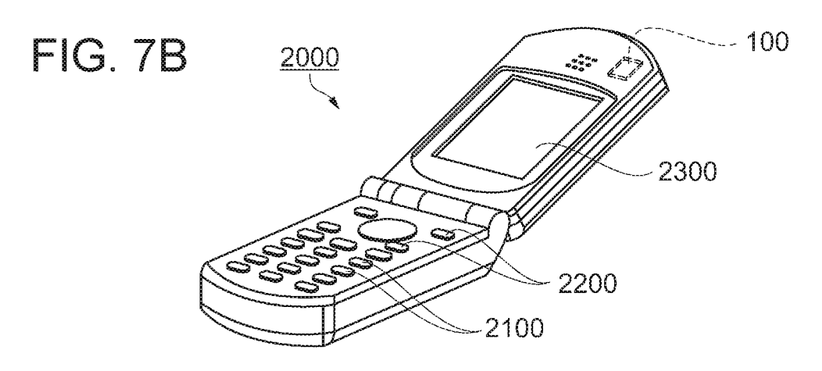
Figure 7C:
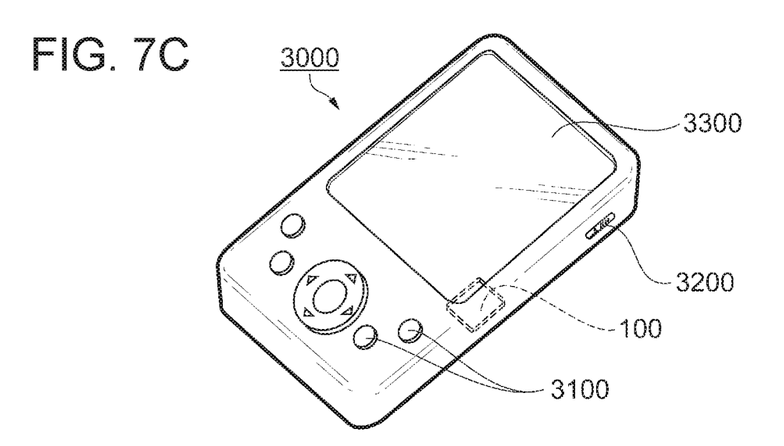

Next, an electronic apparatus including the vibration element according to the above-mentioned embodiment will be described with reference to FIGS. 7A to 7C. Meanwhile, in the following description, an example in which the gyro element 100 is used as an example of the vibration element will be described. FIGS. 7A to 7C are perspectives view illustrating an example of an electronic apparatus including the gyro element 100.

FIG. 7A illustrates an example in which the gyro element 100 is applied to a digital video camera 1000 as an electronic apparatus. The digital video camera 1000 includes an image receiving unit 1100, an operating unit 1200, a voice input unit 1300, and a display unit 1400. Such a digital video camera 1000 can be provided with a shaking correction function of mounting the gyro element 100 of the aforementioned embodiment.

FIG. 7B illustrates an example in which the gyro element 100 is applied to a cellular phone 2000 as an electronic apparatus. The cellular phone 2000 shown in FIG. 7B includes a plurality of operation buttons 2100 and scroll buttons 2200, and a display unit 2300. A screen which is displayed on the display unit 2300 is scrolled by operating the scroll buttons 2200.

FIG. 7C illustrates an example in which the gyro element 100 is applied to a personal digital assistant (PDA) 3000 as an electronic apparatus. The PDA 3000 shown in FIG. 7C includes a plurality of operation buttons 3100, a power supply switch 3200, and a display unit 3300. When the power supply switch 3200 is operated, various types of information such as an address book or an appointment book are displayed on the display unit 3300.

The gyro element 100 of the aforementioned embodiment is mounted in the cellular phone 2000 or the PDA 3000, and thus various functions can be provided. For example, when a camera function (not shown) is provided to the cellular phone 2000 of FIG. 7B, shaking correction can be performed similarly to the above-mentioned digital video camera 1000. In addition, when a global positioning system widely known as a GPS is included in the cellular phone 2000 of FIG. 7B or the PDA 3000 of FIG. 7C, the gyro element 100 of the aforementioned embodiment is mounted therein, the position or posture of the cellular phone 2000 or the PDA 3000 can be recognized by the GPS.

Meanwhile, in addition to the digital video camera 1000 of FIG. 7A, the cellular phone of FIG. 7B, and the personal digital assistant of FIG. 7C, the vibration element which is an example of the gyro element 100 according to the embodiment of the invention can be applied to electronic apparatuses such as, for example, an ink jet ejecting apparatus (for example, ink jet printer), a laptop personal computer, a television, a video camera, a video tape recorder, a car navigation device, a pager, an electronic notebook (also including a communication function), an electronic dictionary, an electronic calculator, an electronic game console, a word processor, a workstation, a TV phone, a security TV monitor, electronic binoculars, a POS terminal, medical instrument (for example, electronic thermometer, sphygmomanometer, blood glucose monitoring system, electrocardiogram measurement device, ultrasound diagnostic device, and electronic endoscope), a fish finder, various types of measuring apparatus, meters and gauges (for example, meters and gauges of a vehicle, an airplane, and a ship), a flight simulator, and the like.

Moving Object

Figure 8:
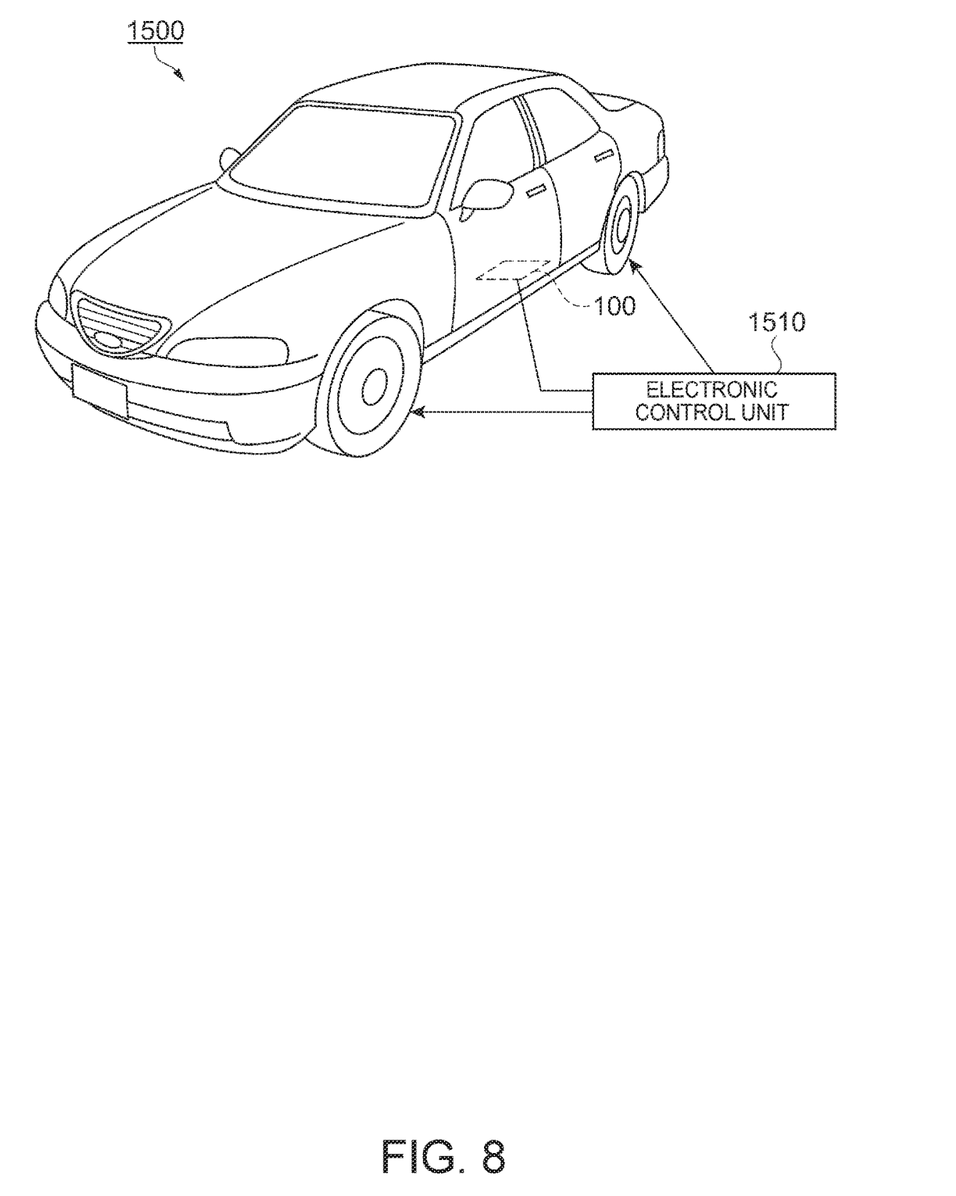
FIG. 8 is a perspective view illustrating an automobile as a moving object including the vibration element.

Next, a moving object including the vibration element according to the above-mentioned embodiment will be described. Meanwhile, in the following description, an example in which the gyro element 100 is used as an example of the vibration element will be described. FIG. 8 is a perspective view schematically illustrating an automobile as an example of the moving object. The automobile 1500 has the gyro element 100 according to the embodiment mounted therein. For example, as shown in the drawing, an electronic control unit 1510 having the gyro element 100 built-in which controls tires or the like is mounted in a car body of the automobile 1500 as the moving object. In addition, as other examples, the gyro element 100 can be applied widely to electronic control units (ECUs) such as a keyless entry, an immobilizer, a car navigation system, a car air conditioner, an antilock brake system (ABS), an air bag, a tire pressure monitoring system (TPMS), an engine controller, a battery monitor of a hybrid automobile or an electric automobile, and a car body posture control system.

As described above, the embodiment has been specifically described, but the invention is not limited to the aforementioned embodiment, and various changes and modifications can be added without departing from the spirit and scope of the invention. For example, in the above embodiment, an example in which a quartz crystal is used as a formation material of the gyro element 100 as the vibration element has been described, piezoelectric materials other than the quartz crystal can be used. For example, it is possible to use a substrate of an oxide such as aluminum nitride (AlN), Lithium Niobate ($LiNbO_3$), Lithium Tantalate ($LiTaO_3$), lead zirconate titanate (PZT), lithium tetraborate ($Li_2B_4O_7$), or langasite crystal ($La_3Ga_5SiO_{14}$), a laminated piezoelectric substrate configured by laminating a piezoelectric material such as aluminum nitride, tantalum pentoxide ($Ta_2O_5$) or the like on a glass substrate, piezoelectric ceramics, or the like.

The entire disclosure of Japanese Patent Application No. 2015-003929, filed Jan. 13, 2015 is expressly incorporated by reference herein.

What is claimed is:

1. A vibration element manufacturing method for manufacturing a vibration element including: a base; a vibrating arm extending from one side of the base in a first direction; and a recess provided in the vibrating arm, the method comprising:
   providing a substrate;
   providing a first patterned mask on the substrate;
   dry etching the substrate by using the first pattered mask as a first etching mask so as to form the base and the vibrating arm;
   providing a second patterned mask on an outer surface of the vibrating arm; and
   wet etching part of the vibrating arm by using the second patterned mask as a second etching mask so as to form the recess in the vibrating arm,
   wherein the recess has an opening, a bottom, and inner side walls in a cross sectional view in the first direction, and
   the inner side walls are inclined so that the opening is wider than the bottom in the cross sectional view in the first direction.

2. The vibration element manufacturing method according to claim 1,
   wherein the first patterned mask is configured with a first metal underlying layer and a metal plating layer stacked on the first metal underlying layer, and
   the second patterned mask is configured with a second metal underlying layer and a resist layer stacked on the second underlying layer.

3. The vibration element manufacturing method according to claim 1,
   wherein the vibrating arm has top and bottom surfaces opposite to each other, and
   the recess further comprises a first recess formed in the top surface and a second recess formed in the bottom surface.

4. The vibration element manufacturing method according to claim 2,
   wherein the vibrating arm has top and bottom surfaces opposite to each other, and
   the recess further comprises a first recess formed in the top surface and a second recess formed in the bottom surface.

5. A vibration element which is manufactured by the manufacturing method according to claim 1, the vibration element comprising:
   the base;
   the vibrating arm extending from one side of the base in the first direction; and
   the recess provided in the vibrating arm.

6. A vibration element which is manufactured by the manufacturing method according to claim 2, the vibration element comprising:
   the base;
   the vibrating arm extending from one side of the base in the first direction; and
   the recess provided in the vibrating arm.

7. A vibration element which is manufactured by the manufacturing method according to claim 3, the vibration element comprising:
   the base;
   the vibrating arm extending from one side of the base in the first direction; and
   the recess provided in the vibrating arm.

8. A vibration element which is manufactured by the manufacturing method according to claim 4, the vibration element comprising:
   the base;
   the vibrating arm extending from one side of the base in the first direction; and
   the recess provided in the vibrating arm.

* * * * *